United States Patent
Cortes Rico

(10) Patent No.: US 10,074,964 B2
(45) Date of Patent: Sep. 11, 2018

(54) VENTILATION COVER FOR AN ELECTRICAL ENCLOSURE

(71) Applicant: Gustavo Cortes Rico, Duluth, GA (US)

(72) Inventor: Gustavo Cortes Rico, Duluth, GA (US)

(73) Assignee: SIEMENS INDUSTRY, INC., Alpharetta, GA (US)

( * ) Notice: Subject to any disclaimer, the term of this patent is extended or adjusted under 35 U.S.C. 154(b) by 486 days.

(21) Appl. No.: 13/855,172

(22) Filed: Apr. 2, 2013

(65) Prior Publication Data

US 2013/0269999 A1    Oct. 17, 2013

Related U.S. Application Data

(60) Provisional application No. 61/622,578, filed on Apr. 11, 2012.

(51) Int. Cl.
  *H02G 3/03*    (2006.01)
  *H02G 5/02*    (2006.01)
  *H05K 5/02*    (2006.01)

(52) U.S. Cl.
  CPC ............. *H02G 3/03* (2013.01); *H05K 5/0213* (2013.01)

(58) Field of Classification Search
  CPC .................. H02G 3/03; H05K 5/0213; H05K 5/20009–5/20181

USPC .......... 361/692; 174/547; 454/189; 362/692, 362/679.49; 312/236

See application file for complete search history.

(56) References Cited

U.S. PATENT DOCUMENTS

| | | | | |
|---|---|---|---|---|
| 2,607,280 | A * | 8/1952 | Purdy | F24F 7/02 454/184 |
| 4,184,414 | A * | 1/1980 | Jarnot | F24F 7/02 454/275 |
| 6,348,653 | B1 * | 2/2002 | Cho | 174/383 |
| 6,359,217 | B1 * | 3/2002 | Thompson | A47B 21/06 174/50 |
| 6,383,072 | B2 * | 5/2002 | Schiedegger | F24F 7/02 454/339 |
| 7,604,534 | B2 * | 10/2009 | Hill | 454/184 |
| 2006/0054335 | A1 * | 3/2006 | Rapp | G01G 21/283 174/481 |
| 2010/0075590 | A1 | 3/2010 | Rico | |

* cited by examiner

*Primary Examiner* — Michael P McFadden

(57) ABSTRACT

A ventilation cover for an electrical enclosure having an aperture that includes a peripheral edge. The cover includes an inner shell having a plurality of inner slots, wherein each inner slot is separated from another inner slot by an inner wall portion. The cover also includes an outer shell for receiving the inner shell, wherein the outer shell includes a plurality of outer slots and each outer slot is aligned with an associated inner wall portion wherein each inner wall portion is adapted to divert water which enters an outer slot. In addition, the cover includes a lip formed around the peripheral edge for inhibiting the flow of water into the aperture.

19 Claims, 5 Drawing Sheets

VENTILATION COVER FOR AN ELECTRICAL ENCLOSURE

CROSS REFERENCE TO RELATED APPLICATION

This application claims the benefit under 35 U.S.C. § 119(e) of U.S. Provisional Application No. 61/622,578 entitled VENTILATION COVER, filed on Apr. 11, 2012 which is incorporated herein by reference in its entirety and to which this application claims the benefit of priority.

FIELD OF THE INVENTION

This invention relates to electrical enclosures and more particularly, to a ventilation cover having an inner shell that includes a plurality of inner slots and an outer shell for receiving the inner shell, wherein the outer shell includes a plurality of outer slots and each outer slot is aligned with an associated inner wall portion of the inner shell for diverting a flow of water.

BACKGROUND OF THE INVENTION

An electrical enclosure typically includes a cabinet for housing electrical or electronic equipment such as electrical distribution equipment. The enclosure may also include switches, knobs, displays and other items. Further, the enclosure may be configured so as to reduce the likelihood of electrical shock to users.

The equipment housed in the enclosure generates heat during operation. If the heat is not vented, the equipment may become overheated thus causing damage to the equipment. For example, overheating can shorten the life expectancy of costly electrical components or lead to catastrophic failure. In order to reduce the likelihood of damage due to heat, an electrical enclosure typically includes vents so that heat generated by the equipment inside the enclosure may be vented outside of the enclosure. The vents are positioned in areas of the cabinet which optimize convection and radiation to facilitate venting of heat. However, the location of the vents in the cabinet also renders the vents susceptible to undesirable intrusion of water, falling debris and other items into the enclosure which may cause damage to the equipment.

SUMMARY OF THE INVENTION

A ventilation cover is disclosed for an electrical enclosure having an aperture that includes a peripheral edge. The cover includes an inner shell having a plurality of inner slots, wherein each inner slot is separated from another inner slot by an inner wall portion. The cover also includes an outer shell for receiving the inner shell, wherein the outer shell includes a plurality of outer slots and each outer slot is aligned with an associated inner wall portion wherein each inner wall portion is adapted to divert water which enters an outer slot. In addition, the cover includes a lip formed around the peripheral edge for inhibiting the flow of water into the aperture.

DESCRIPTION OF THE INVENTION

Figure 1:
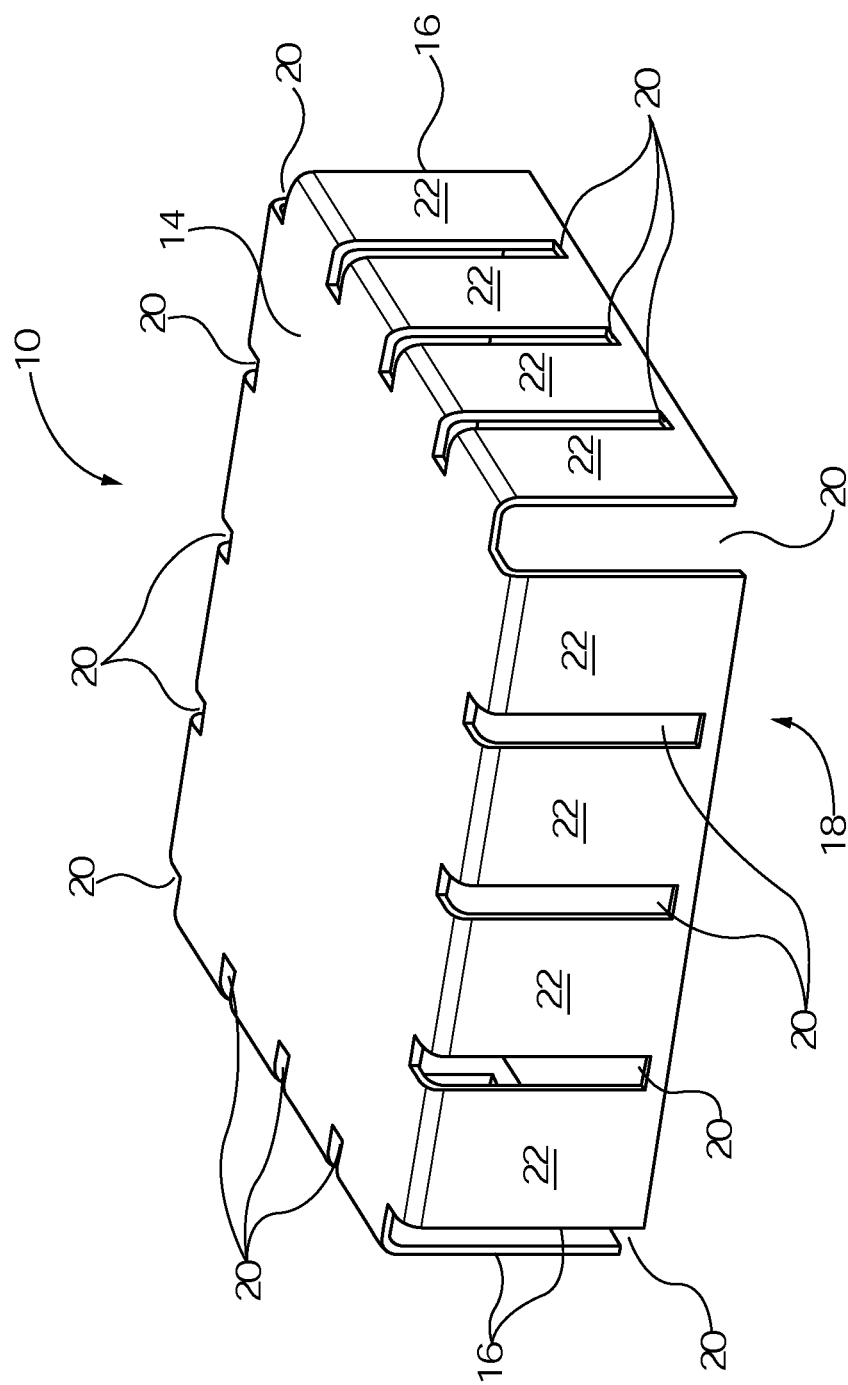
FIG. 1 depicts an inner shell for a ventilation cover for an electrical enclosure.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass direct and indirect mountings, connections, supports, and couplings. Further, "connected" and "coupled" are not restricted to physical or mechanical connections or couplings. In the description below, like reference numerals and labels are used to describe the same, similar or corresponding parts in the several views of FIGS. 1-6.

Referring to FIG. 1, an inner shell 10 for a ventilation cover 12 (see FIG. 3) for an enclosure is shown. The inner shell 10 includes an inner center portion 14 and downwardly extending inner side walls 16 to form an inner shell cavity 18. In one embodiment, the inner center portion 14 has a rectangular shape to form four inner side walls 16. In another embodiment, the inner center portion 14 has a circular shape to form a downwardly extending circular inner side wall 16. In accordance with the invention, other shapes may be used. Each inner side wall 16 includes a plurality of vertically or downwardly extending inner slots 20 that are spaced apart from each other along a respective inner side wall 16 in accordance with a first spacing arrangement. Each slot 20 is separated from an adjoining slot 20 by an inner wall portion 22.

Figure 2:
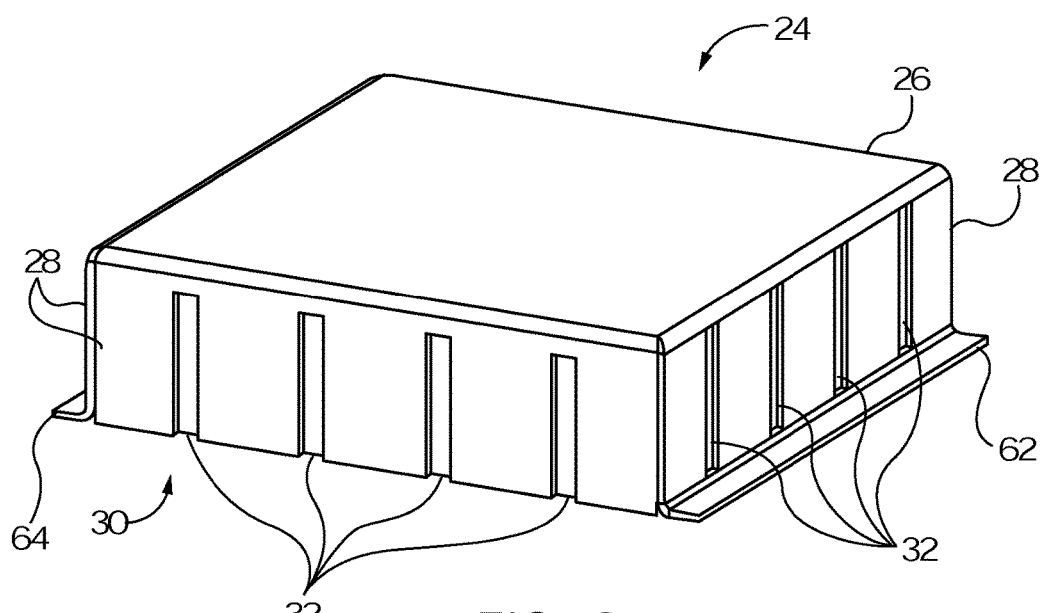
FIG. 2 depicts an outer shell for the cover.

Referring to FIG. 2, an outer shell 24 for the cover 12 is shown. The outer shell 24 is larger than the inner shell 10. The outer shell 24 includes an outer center portion 26 and downwardly extending outer side walls 28 to form an outer shell cavity 30. A shape of the outer center portion 26 and outer side walls 28 corresponds to a shape of the inner center portion 14 and inner side walls 16. In particular, the outer center portion 26 may have a rectangular shape to form four outer side walls 28. In another embodiment, the outer center portion 26 has a circular shape to form a downwardly extending circular outer side wall 28. Each outer side wall 28 includes a plurality of vertically or downwardly extending outer slots 32 that are spaced apart from each other along a respective outer side wall 28 in accordance with a second spacing arrangement. The second spacing arrangement of the outer slots 32 is offset from first spacing arrangement of the inner slots 20. The inner 10 and outer 24 shells may be fabricated from any suitable material such as sheet metal or plastic.

Figure 3:
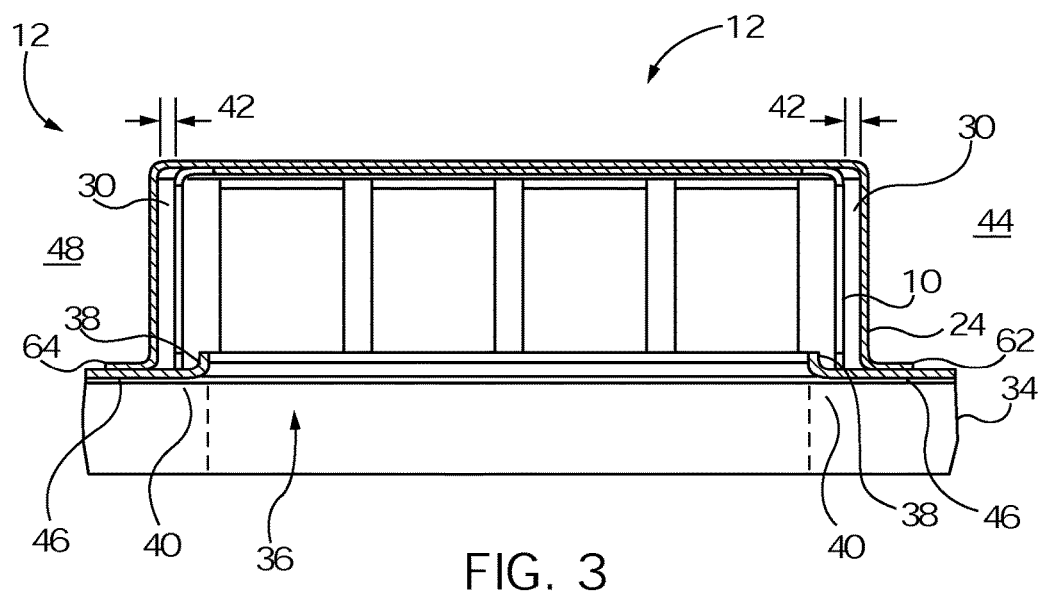
FIG. 3 depicts the inner shell assembled within an outer shell cavity of the outer shell to form the ventilation cover.

Referring to FIG. 3, the inner shell 10 is shown nestled or assembled within the outer shell cavity 30 to form the ventilation cover 12. The inner 16 and outer 28 walls are separated by a gap 42 due to a difference in size between the inner 10 and outer 24 shells. The inner 10 and outer 24 shells are aligned with an opening 36 formed on a top surface 46 of an enclosure 34 (shown as a partial view) to enable venting of air from the enclosure 34. The outer shell 24 further includes first 62 and second 64 flanges which extend from associated side walls 28. The first 62 and second 64 flanges are used to affix the outer shell 24 to the top surface 46 such as by welding or fasteners. The top surface 46 also includes a shallow wall or upwardly extending lip 38 that surrounds a peripheral edge 40 of the opening 36. When assembled, the outer slots 32 are each aligned with an inner wall portion 22 but are not aligned with inner slots 20. The positioning of the inner slots 20 and inner wall portions 22 relative to the outer slots 32, along with gap 42, result in the formation of air passageways in the form of a labyrinth which serve to vent the enclosure 34.

In addition, a fluid such as rain water flowing into an outer slot 32 from a first side 44, for example, of the enclosure 34 is subsequently diverted by an inner wall portion 22. As additional water accumulates on the surface 46, the water flows through an inner slot 20 and is then stopped by the lip 38 from flowing within the aperture 36 and thus into the enclosure 34. In one embodiment, the top surface 46 is sufficiently angled relative to horizontal such that the water then flows around the lip 38 and through inner 20 and outer 32 slots on a second side 48 of the enclosure 34 opposite the first side 44 in which the water entered.

An enclosure using a ventilation cover in accordance with the invention, such as ventilation cover 12, was rain tested in accordance with Underwriters Laboratories UL Standard 50 entitled ENCLOSURES FOR ELECTRICAL EQUIPMENT, NON-ENVIRONMENTAL CONSIDERATIONS and UL Standard 67 entitled STANDARD FOR PANELBOARDS. As a result of the test, it was found that the enclosure and ventilation cover in accordance with current invention were in compliance with aforementioned UL standards. In addition, it was found that the ventilation cover 12 also meets UL requirements directed to inhibiting access to an energized component within the enclosure by use of a wire.

Figure 4:
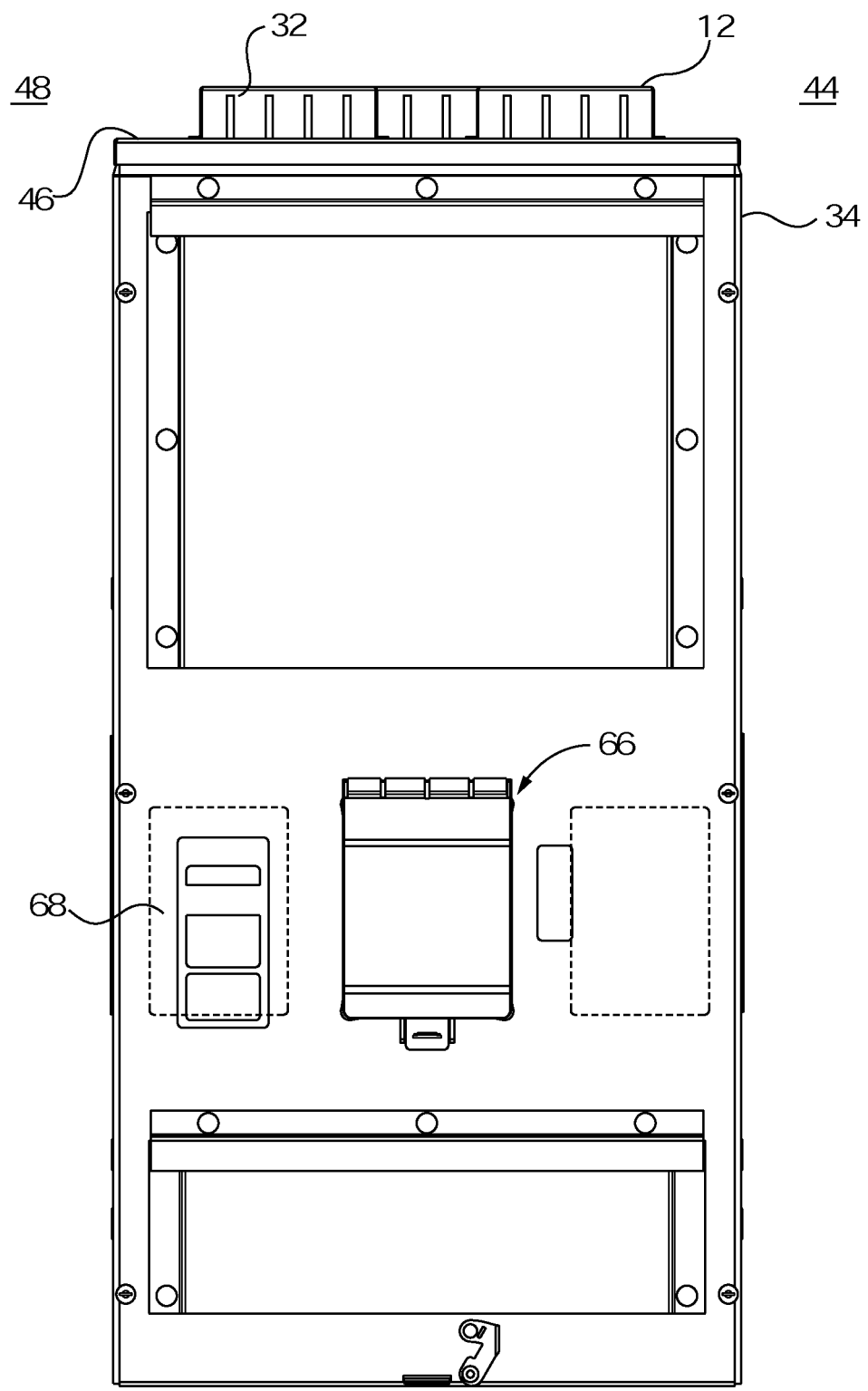
FIG. 4 depicts the ventilation cover located on the enclosure.
Figure 5:
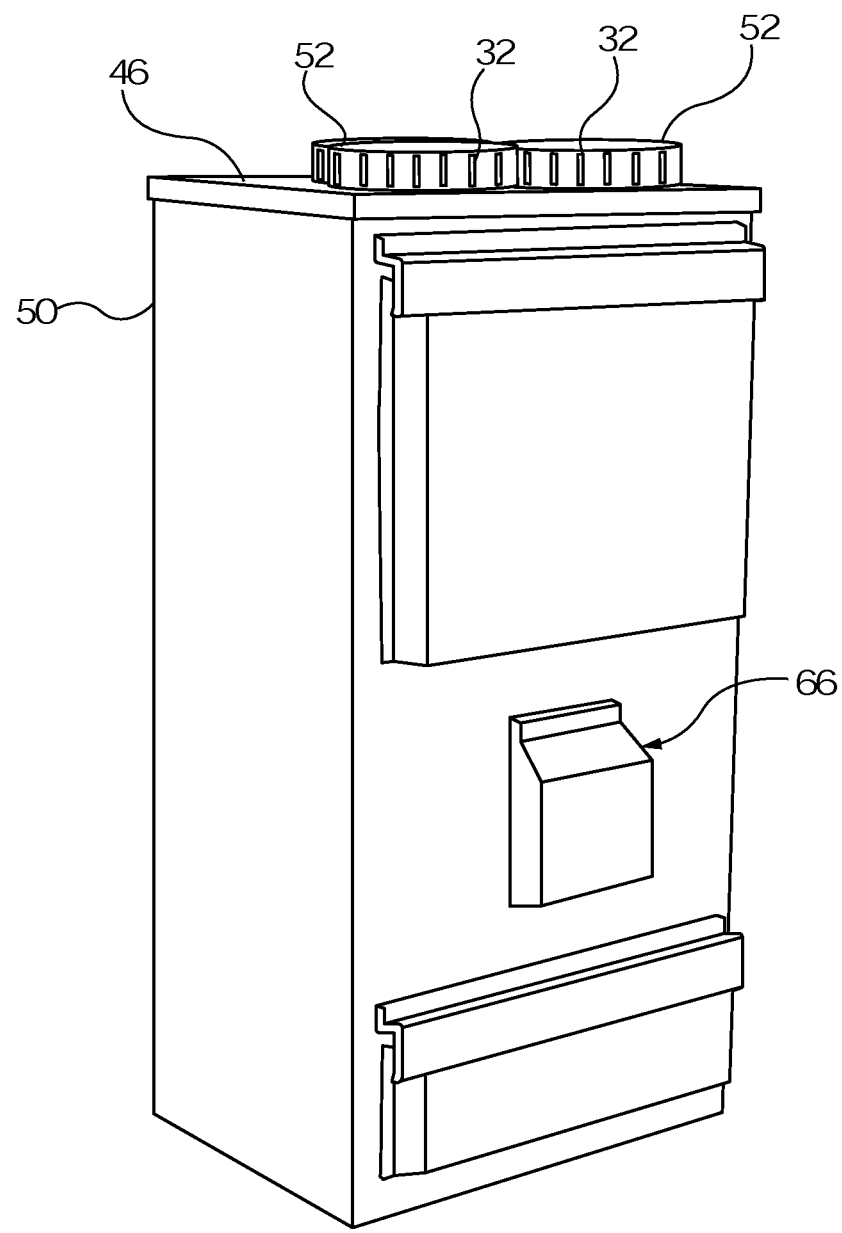
FIG. 5 depicts an enclosure having round ventilation covers.
Figure 6:
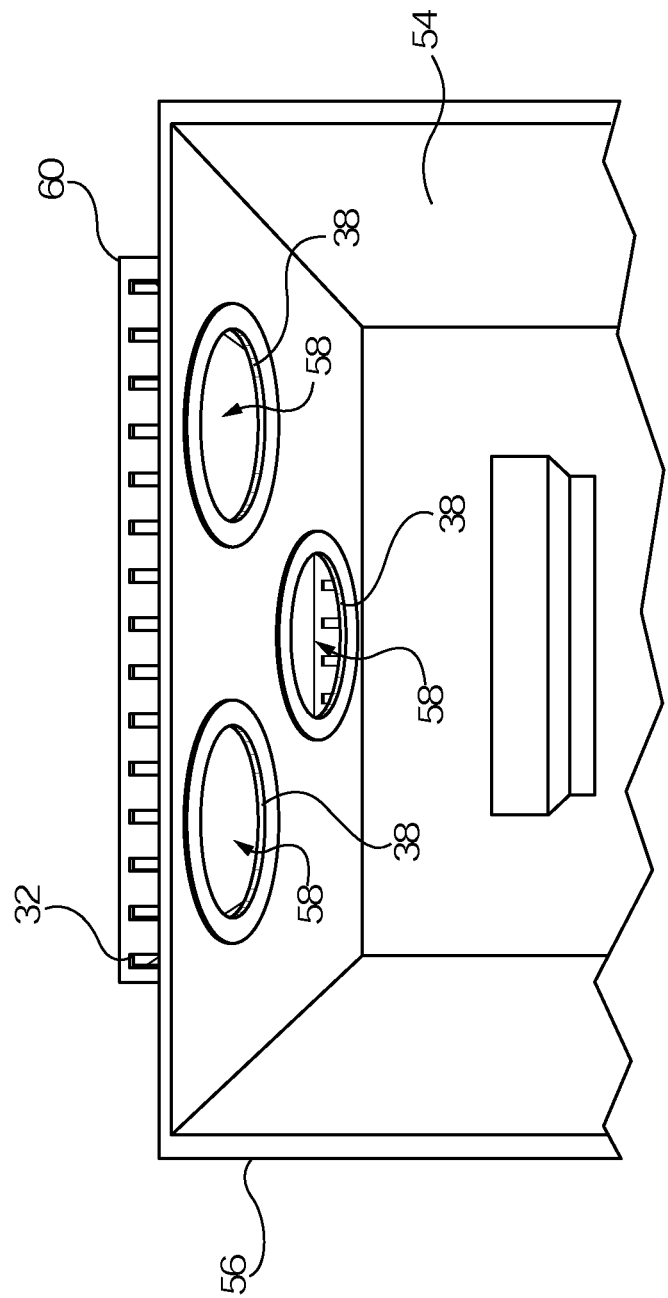
FIG. 6 is a partial view of an interior of an enclosure which includes a plurality of apertures associated with a cover.

Referring to FIG. 4, the enclosure 34 may be an electrical enclosure for outdoor use which includes a cabinet that houses electrical or electronic equipment including electrical distribution equipment such as circuit breakers 66 and electrical buses. The enclosure 34 may also include switches, knobs, displays 68 and other items. Further, the enclosure may be configured so as to reduce the likelihood of electrical shock to users. Referring to FIG. 5, an enclosure 50 is shown which includes round ventilation covers 52. Referring to FIG. 6, a partial view of an interior 54 of an enclosure 56 is shown which includes a plurality of apertures 58. In accordance with the invention, a ventilation cover 60 may be sized so as to cover the plurality of apertures 58. In an alternate embodiment, a ventilation cover may be used on a side or vertical surface of an enclosure. Further, the inner 20 and outer 32 slots may be oriented horizontally, angled or any combination thereof. In addition, the disclosure of U.S. Patent Publication No. 2010/0075590 (U.S. application Ser. No. 12/559,600) filed on Sep. 15, 2009 entitled PASSIVE VENTILATION FOR OUTDOOR ELECTRICAL ENCLOSURES is incorporated herein by reference in its entirety.

While the invention has been described in conjunction with specific embodiments, it is evident that many alternatives, modifications, permutations and variations will become apparent to those skilled in the art in light of the foregoing description. Accordingly, it is intended that the present invention embrace all such alternatives, modifications and variations.

What is claimed is:

1. A ventilation cover for an outdoor electrical enclosure having a horizontal enclosure surface that includes an aperture having a peripheral edge wherein heated air from the enclosure is vented in a vertical direction through the aperture, comprising:
    an inner shell having an inner shell surface, wherein the inner shell includes at least one inner side surface oriented transverse to the inner shell surface and wherein the at least one inner side surface includes a plurality of inner slots, wherein each inner slot is separated from another inner slot by a transverse inner wall portion;
    an outer shell for receiving the inner shell, wherein the outer shell includes a horizontal outer shell surface for blocking the aperture from outdoor environmental conditions and wherein the outer shell includes at least one outer side surface oriented transverse to the horizontal outer shell surface wherein the at least one outer side surface includes a plurality of vertical outer slots for venting the heated air in a vertical direction and wherein each vertical outer slot is aligned with an associated transverse inner wall portion; and
    an upwardly extending lip formed in the horizontal enclosure surface of the outdoor electrical enclosure, wherein the upwardly extending lip surrounds the peripheral edge of the aperture, wherein the inner shell and the outer shell are aligned with the aperture formed on the horizontal enclosure surface of the outdoor electrical enclosure such that the inner shell is nestled within the outer shell and the inner shell surrounds the aperture,
    wherein the upwardly extending lip is disposed adjacent to the aperture such that the upwardly extending lip is enclosed by both the inner shell and the outer shell, and
    wherein the outer shell further includes first and second flanges which extend from associated side walls such that the first and second flanges are used to affix the outer shell to the horizontal enclosure surface.

2. The ventilation cover according to claim 1, wherein a spacing of the inner slots is offset from a spacing of the outer slots.

3. The ventilation cover according to claim 1, wherein the inner and outer slots form air passageways for venting the enclosure.

4. The ventilation cover according to claim 1, wherein water entering an outer slot is diverted by an inner wall.

5. The ventilation cover according to claim 1, wherein the inner and outer slots are oriented vertically.

6. The ventilation cover according to claim 1, wherein a shape of the inner shell corresponds to a shape of the outer shell.

7. The ventilation cover according to claim 6, wherein outer shell has a rectangular shape.

8. The ventilation cover according to claim 1, wherein the inner and outer shells are fabricated from plastic.

9. The ventilation cover according to claim 1, wherein the inner and outer shells are fabricated from metal.

10. A ventilation cover for an outdoor electrical enclosure having a horizontal enclosure surface that includes an aperture having a peripheral edge wherein heated air from the enclosure is vented in a vertical direction through the aperture, comprising:
  an inner shell having an inner shell surface, wherein the inner shell includes at least one inner side surface oriented transverse to the inner shell surface and wherein the at least one inner side surface includes a plurality of inner slots, wherein each inner slot is separated from another inner slot by a transverse inner wall portion;
  an outer shell for receiving the inner shell, wherein the outer shell includes a horizontal outer shell surface for blocking the aperture from outdoor environmental conditions and wherein the outer shell includes at least one outer side surface oriented transverse to the horizontal outer shell surface wherein the at least one outer side surface includes a plurality of vertical outer slots for venting the heated air in a vertical direction and wherein each vertical outer slot is aligned with an associated transverse inner wall portion and wherein each transverse inner wall portion is adapted to divert water which enters an outer slot; and
  a lip formed around the peripheral edge of the aperture formed in the horizontal enclosure surface of the outdoor electrical enclosure for inhibiting the flow of water into the enclosure, wherein the inner shell and the outer shell are aligned with the aperture formed on the horizontal enclosure surface of the outdoor electrical enclosure such that the inner shell is nestled within the outer shell and the inner shell surrounds the aperture,
  wherein the upwardly extending lip is disposed adjacent to the aperture such that the upwardly extending lip is enclosed by both the inner shell and the outer shell, and
  wherein the outer shell further includes first and second flanges which extend from associated side walls such that the first and second flanges are used to affix the outer shell to the horizontal enclosure surface.

11. The ventilation cover according to claim 10, wherein a spacing of the inner slots is offset from a spacing of the outer slots.

12. The ventilation cover according to claim 10, wherein the inner and outer slots form air passageways for venting the enclosure.

13. The ventilation cover according to claim 10, wherein the inner and outer slots are oriented vertically.

14. The ventilation cover according to claim 10, wherein a shape of the inner shell corresponds to a shape of the outer shell.

15. The ventilation cover according to claim 14, wherein outer shell has a rectangular shape.

16. The ventilation cover according to claim 14, wherein the outer shell has a round shape.

17. The ventilation cover according to claim 10, wherein the cover is associated with more than one aperture.

18. The ventilation cover according to claim 16, wherein the covers are fabricated from plastic.

19. An outdoor electrical enclosure, comprising:
  a cabinet having a horizontal top surface that includes an aperture having a peripheral edge wherein heated air from the cabinet is vented in a vertical direction through the aperture;
  a ventilation cover including:
    an inner shell having an inner shell surface, wherein the inner shell includes at least one inner side surface oriented transverse to the inner shell surface and wherein the at least one inner side surface includes a plurality of inner slots, wherein each inner slot is separated from another inner slot by a transverse inner wall portion;
    an outer shell for receiving the inner shell, wherein the outer shell includes a horizontal outer shell surface for blocking the aperture from outdoor environmental conditions and wherein the outer shell includes at least one outer side surface oriented transverse to the horizontal outer shell surface wherein the at least one outer side surface includes a plurality of vertical outer slots for venting the heated air in a vertical direction and wherein each vertical outer slot is aligned with an associated transverse inner wall portion; and
    a lip formed around the peripheral edge of the aperture formed in the horizontal top surface of the outdoor electrical enclosure, wherein water entering an outer slot located on a first side of the enclosure is diverted by an inner wall and water that flows through an inner slot is then inhibited by the lip from flowing within the aperture and wherein the horizontal top surface is angled such that water flows around the lip and through an outer slot on a second side of the enclosure opposite the first side, wherein the inner shell and the outer shell are aligned with the aperture formed on the horizontal enclosure surface of the outdoor electrical enclosure such that the inner shell is nestled within the outer shell and the inner shell surrounds the aperture,
  wherein the upwardly extending lip is disposed adjacent to the aperture such that the upwardly extending lip is enclosed by both the inner shell and the outer shell, and
  wherein the outer shell further includes first and second flanges which extend from associated side walls such that the first and second flanges are used to affix the outer shell to the horizontal enclosure surface.

* * * * *